(12) United States Patent
Levine et al.

(10) Patent No.: US 9,940,419 B1
(45) Date of Patent: Apr. 10, 2018

(54) POST DESIGN INTEGRATED CIRCUIT MANUFACTURING OBFUSCATION

(71) Applicant: The United States of America as Represented by the Secretary of the Army, Washington, DC (US)

(72) Inventors: Neal Levine, Davis, CA (US); Aman Gahoonia, Rocklin, CA (US); Jon Lloyd, Elk Grove, CA (US); David W. Pentrack, Granite Bay, CA (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 0 days.

(21) Appl. No.: 15/139,625

(22) Filed: Apr. 27, 2016

Related U.S. Application Data

(60) Provisional application No. 62/201,214, filed on Aug. 5, 2015.

(51) Int. Cl.
*G06F 17/00* (2006.01)
*G06F 17/50* (2006.01)

(52) U.S. Cl.
CPC ...... *G06F 17/5045* (2013.01); *G06F 17/5036* (2013.01)

(58) Field of Classification Search
USPC .............................................. 716/102
See application file for complete search history.

(56) References Cited

U.S. PATENT DOCUMENTS

| | | | |
|---|---|---|---|
| 2004/0117748 A1* | 6/2004 | Tester | G06F 17/5068 716/112 |
| 2008/0222580 A1* | 9/2008 | Banerjee | G06F 17/5045 716/136 |
| 2009/0077507 A1* | 3/2009 | Hou | G06F 17/5036 716/136 |
| 2012/0210279 A1* | 8/2012 | Hsu | G03F 1/70 716/53 |
| 2012/0226479 A1* | 9/2012 | Su | G06F 17/5077 703/1 |
| 2015/0186584 A1* | 7/2015 | Aenuganti | G06F 17/5072 716/55 |

* cited by examiner

*Primary Examiner* — Mohammed Alam
(74) *Attorney, Agent, or Firm* — John P. DiScala

(57) ABSTRACT

Integrated circuit design layout files are partitioned into one or more design layout files containing data for Front-End-Of-Line sub-circuits and one or more design layout files containing data for Back-End-Of-Line sub-circuits. By sending each of the files to a separate foundry for manufacture, an intellectual property owner can ensure integrity of his property as no individual file alone contains sufficient information to deduce the overall function of the integrated circuit.

9 Claims, 4 Drawing Sheets

9,940,419 B1

POST DESIGN INTEGRATED CIRCUIT MANUFACTURING OBFUSCATION

FEDERAL RESEARCH STATEMENT

The invention described herein may be manufactured, used, and licensed by or for the U.S. Government for U.S. Government purposes.

CROSS REFERENCE TO RELATED APPLICATION

The present application is a non-provisional application of U.S. provisional application Ser. 62/201,214, filed Aug. 5, 2015, the contents of which are incorporated herein by reference.

BACKGROUND OF INVENTION

Field of the Invention

The present invention relates to integrated circuits, and more particularly to supply chain management of integrated circuits.

Related Art

Integrated circuits contain intellectual property that is essential to the smooth operation of the financial, national defense and civic institutions. Whether for strategic advantage, economic gain or other nefarious purposes, the theft and exploitation of this confidential information is a threat to national security and the functioning of the economy.

A growing number of organizations both commercial and governmental are utilizing various means to attempt to protect the confidentiality of the integrated circuits residing within their most critical systems (e.g., Banking, Civic Infrastructure, DOD etc.). This protection is typically derived through the use of integrated circuit obfuscation techniques as well as the careful vetting of staff members and facilities associated with the design, wafer fabrication, assembly and testing of their circuits. Unfortunately both techniques are limited in their effectiveness in that the cleverness of any circuit obfuscation technique will inevitably be overcome by the greater cleverness of an adversary and that no vetting technique of human beings is without error.

Accordingly, there is a need for an integrated circuit manufacturing scheme that provides significant integrity and confidentiality protection by utilizing a design for manufacturing technique that, by its structure, provides no circuit function information to the manufacturing foundry thus mitigating the risks associated with the manufacturing of extremely sensitive circuits within a foundry that has not been vetted.

SUMMARY OF INVENTION

The present invention relates to a method for mitigating the risk of intellectual property theft in integrated circuit manufacturing. Integrated circuit design layout files are partitioned into one or more design layout files containing data for front-end-of-line sub-circuits and one or more design layout files containing data for back-end-of-line sub-circuits. The present invention derives risk mitigation benefits by morphing (partitioning) a completed traditional integrated circuit design file into multiple design files such that one design file will contain all of the layout information for a Front End of Line (FEOL) sub-circuit and multiple single layout layer design files will be created for each of the required Back End of Line (BEOL) sub-circuits (layout layers). By sending the FEOL sub-circuit design file and each of the BEOL single layer sub-circuit design files to separate foundries to be manufactured on individual substrates (e.g. silicon), an intellectual property owner can ensure integrity of his property as no individual file alone contains sufficient information to deduce the overall function of the integrated circuit. The multiple individual substrates, once fabricated (manufactured), will be physically stacked at a customer chosen location.

According to a first aspect of the invention, a method for reducing risk of intellectual property theft during the manufacture of integrated circuits comprises the steps of: designing an integrated circuit design file; dividing the integrated circuit design file into a plurality of layer layout files, wherein the one or more layer files comprise at least one front end of line layer file and at least one back end of line layer file; providing the at least one front end of line layer file to a first foundry; providing the at least one back end of line layer file to a second foundry; receiving at least one front end of line layer from the first foundry; receiving at least one back end of line layer file from the second foundry; and assembling the at least one front end of line layer and the at least one back end of line layer into an integrated circuit.

According to a second aspect of the invention, a three dimensional integrated circuit includes of a plurality of vertically stacked sub-circuits. The sub-circuits of the three dimensional integrated circuit are partitioned such that no individual sub-circuit comprises both transistor structure layers and transistor interconnections.

BRIEF DESCRIPTION OF THE DRAWINGS

The accompanying figures further illustrate the present invention.

The components in the drawings are not necessarily drawn to scale, emphasis instead being placed upon clearly illustrating the principles of the present invention. In the drawings, like reference numerals designate corresponding parts throughout the several views.

DETAILED DESCRIPTION

Figure 1:
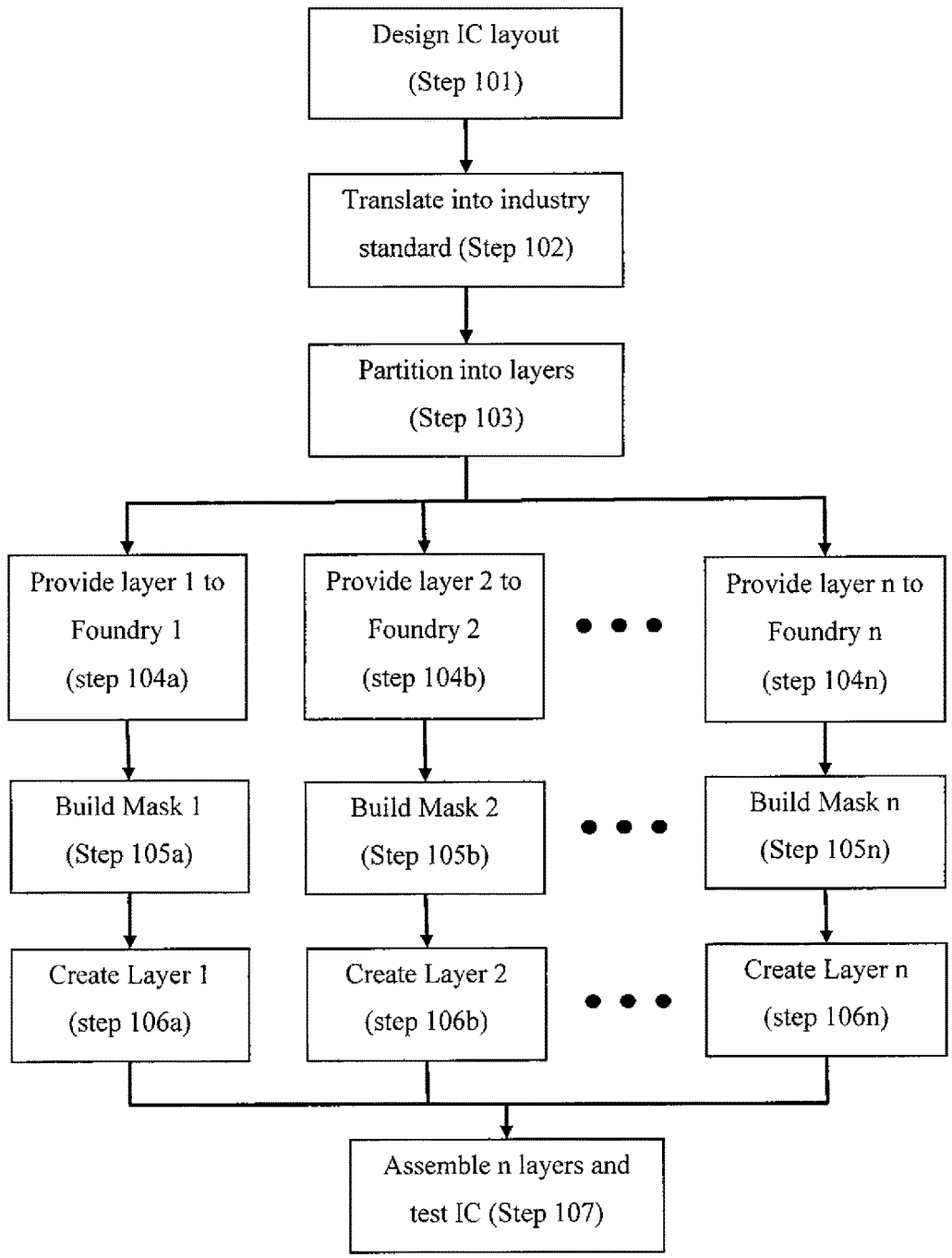
FIG. 1 is a flowchart illustrating steps for a method of reducing risk of trade secret misappropriation in integrated circuit manufacture, in accordance with an illustrative embodiment of the invention.

The present invention relates to a method for reducing risk of intellectual property misappropriation in the manufacture of proprietary integrated circuits (ICs). Risk of theft is reduced by dividing the manufacture of the integrated circuit among multiple foundries. Each foundry only receives information pertaining to the portion of work they are completing, none of which is sufficient to deduce the purpose of the complete integrated circuit.

In the course of traditional integrated circuit (IC) manufacturing, designers instantiate cells from a cell library into a single design file. By combining these cells, designers create a functional design. The final design file is then partitioned into multiple design layout layer files that will be successively used for the fabrication of successive physical layers within the integrated circuit.

The physical layers that define the individual transistors within an integrated circuit can be referred to as Front-End-Of-Line (FEOL) sub-circuits. The physical layers that define electrical interconnections between transistors can be referred back to as Back-End-Of-Line (BEOL) sub-circuits.

Risk mitigation benefits are derived by morphing (partitioning) the completed traditional integrated circuit design file into multiple design files such that one design file will contain all of the layout information for the FEOL sub-circuit and multiple single layout files layer design files will be created for each of the required BEOL sub-circuits (layout layers). By sending the FEOL sub-circuit design file and each of the BEOL single layer sub-circuit design file to separate foundries to be manufactured on individual substrates (e.g. silicon), an intellectual property owner can ensure integrity of his property as no individual file alone contains sufficient information to deduce the overall function of the integrated circuit. The multiple individual substrates, once fabricated or manufactured, will be physically stacked at a location and employing safeguards of a customer's choosing.

Contrary to previous methodologies derived for defining the stackable sub-circuits, in which the designer creatively partitions the circuit in a manner that deliberately obscures the intent and functionality of the circuit, in the present method the sub-circuit layout files are defined in a manner that is consistent with the normal vertical architecture of a typical integrated circuit. The design engineer does not need to be explicitly aware of the intended subsequent portioning of the IC while completing the basic design flow (GDSII). Specifically, whereas a normal integrated circuit is composed of successive layers of metal interconnects (e.g.; submicron "wires") that are successively fabricated on top of a single substrate, this invention defines each layer of metal interconnects as its own stackable sub-circuit. In this methodology each interconnect layer is fabricated in a different foundry on a different substrate and the substrates (interconnects) are subsequently stacked. Whereas previous design methodologies require that the design engineer significantly change and adapt his basic GDSII design file, additional effort that is required by this invention is performed subsequent to the completion of the basic GDSII file design and may be performed by a layout engineer and simulation engineer. The task required by the layout engineer is to morph the contact and vias from the GDSII file into a pad pattern to be used for sub-circuit to sub-circuit vertical current flow. This pad pattern will appear as the top layer of every bottom (sub-circuit) wafer (substrate) and the underside of every sub-circuit that is to be stacked. The task required of the simulation engineer is to adjust the signal delay times ordinarily associated with transmission through a normal contact or via with delay times associated with signal transmission to and from vertically stacked sub-circuits.

Sub-circuits in the context of this invention are either completed front end of line wafers (i.e., individual transistors that are not interconnected) or individual interconnect layers as defined in the designer's GDSII file. Sub-circuits that are defined in this manner are widely understood throughout the integrated circuit industry to be by their nature devoid of algorithm information.

FIG. 1 is a flowchart illustrating steps for a method of reducing risk of trade secret misappropriation in integrated circuit manufacture, in accordance with an illustrative embodiment of the present invention.

In step 101, a designer designs an integrated circuit (IC) layout for an integrated circuit. The IC layout may be embodied in an IC layout file. The IC layout, also known as the IC mask layout, or mask design, is the representation of an integrated circuit in terms of planar geometric shapes which correspond to the patterns of metal, oxide, or semiconductor layers that make up the components of the integrated circuit.

The positions and interconnections of the geometric shapes detailed in the IC layout determine the function of the final IC. Using a computer-aided layout tool, the layout engineer—or layout technician—places and connects all of the components that make up the chip such that they meet certain criterion—typically: performance, size, density, and manufacturability.

Advantageously, the method for reducing risk does not require the design technician to deviate from his usual design methodology. The sub-circuit layout files are defined in a manner that is consistent with the normal vertical architecture of a typical integrated circuit. The designer need not design the IC layout with knowledge of or regard to the partitioning step to be performed later in the process. As such, the partitioning step may be performed retroactively to existing IC designs. Accordingly, the present method allows the circuit designer to design the simplest most straight forward implementation of the algorithm while passing off the partitioning to a mask interface technician.

Typically, an initial IC layout file may be programmed in a hardware description language (HDL) using IC layout editor software or Electronic Design Automation (EDA) software. An HDL, such as VHDL, is a specialized computer language used to program the structure, design and operation of integrated circuits. A hardware description language enables a precise, formal description of an electronic circuit that allows for the automated analysis, simulation, and simulated testing of an electronic circuit.

In implementations in which a designer models the IC layout to determine and test various operational characteristics and parameters, the designer may substitute the interconnect delay simulation model associated with a non-partitioned IC's with an interconnect delay simulation model which accounts for the longer transmission times associated with the partitioned circuit. Particularly, as will be described in more detail below, the transistor to transistor interconnections are contained on a separate layer as the circuit components. As these layers are electrically connected by through silicon vias (TSVs) and sub-circuit to sub-circuit interconnect technologies (e.g., ball bumping), the transmission time of electrical signals may be delayed slightly longer than if the connections were made in a non-partitioned circuit. The designer in charge of simulation, or the simulation engineer, adjusts the signal delay times ordinarily associated with transmission through a normal contact or via with delay times associated with signal transmission to and from vertically stacked sub-circuits.

In step 102, the IC layout file is translated into an industry standard format. Once testing and verification has been completed, the IC layout file is translated to an industry standard format such as GDSII or Open Artwork System Interchange Standard (OASIS). GDSII, is a database file format which is currently the de facto industry standard for data exchange of integrated circuit or IC layout artwork. It is a binary file format representing planar geometric shapes, text labels, and other information about the layout in hierarchical form. The data can be used to reconstruct all or part of the artwork to be used in sharing layouts, transferring artwork between different tools, or creating photomasks.

In step 103, a mask interface technician of the design team partitions the IC layout file into multiple IC layer files. Additionally the mask interface technician will use the original design's via mask layout file to create four additional layout files to be associated with each interconnect layout file. Two of the additional layout files will be used to create a pair of high aspect ratio vertical (via) channels, one originating at the via termination on the top side of the bottom wafer that travels vertically through the protective oxide to the oxide's surface, the other that travels through the top wafer's underside oxide that travels vertically through the oxide and through the silicon TSVs until it reaches the opposite via termination. The other two layout files are used to create stackable pads that will allow the topside of the bottom wafer to electrically mate with the underside of the top wafer and will electrically connect to the topside and underside vertical (via) channels. Once stacked each pair of vertical (via) channels together with their stackable pads function in a manner that is electrically identical to the vias that are typically described within an ordinary circuit layout that does not use this invention.

Where-as typically a single design layout file containing all of the circuit design layout information is sent to a single manufacturing foundry to facilitate the fabrication of all of the photolithographic layers necessary for the fabrication of all of the layers of a specific integrated circuit, in the present scheme, the design team to, instead, partitions the single design layout file into multiple design layer files with each layer file containing data for one or more specific photolithographic layers. Each layer file (aka sub-circuit) could then be sent to a different foundry for the fabrication of the one or more layers defined by that layer file.

The mask interface technician partitions the IC layout file into groups of one or more layers according to the layer type and overall architecture of the IC, with each group corresponding to a sub-circuit, or layout file, of the overall vertically stacked IC. Each of the sub-circuits are either a FEOL sub-circuit or a BEOL sub-circuit. The mask interface technician would typically include all of the FEOL structures into a single sub-circuit while creating multiple stackable sub-circuits for each of the circuit's metal interconnect layers.

An FEOL sub-circuit layer file only contains data needed to define multiple photolithographic layers that are necessary for the fabrication of individual transistors as well as the photolithographic layer data needed for the fabrication of electrical connections to the structures within those transistors, but would contain no data describing transistor to transistor interconnections.

A BEOL sub-circuit only contains data for one photolithographic layer of the circuit interconnections or one photolithographic layer defining the interconnections between metal layers (aka vias), but no transistor structure data.

Accordingly, the IC is partitioned such that transistors are contained on wafers independent of the transistor interconnects which are contained on one or more wafers independent of the transistors.

Figure 2:
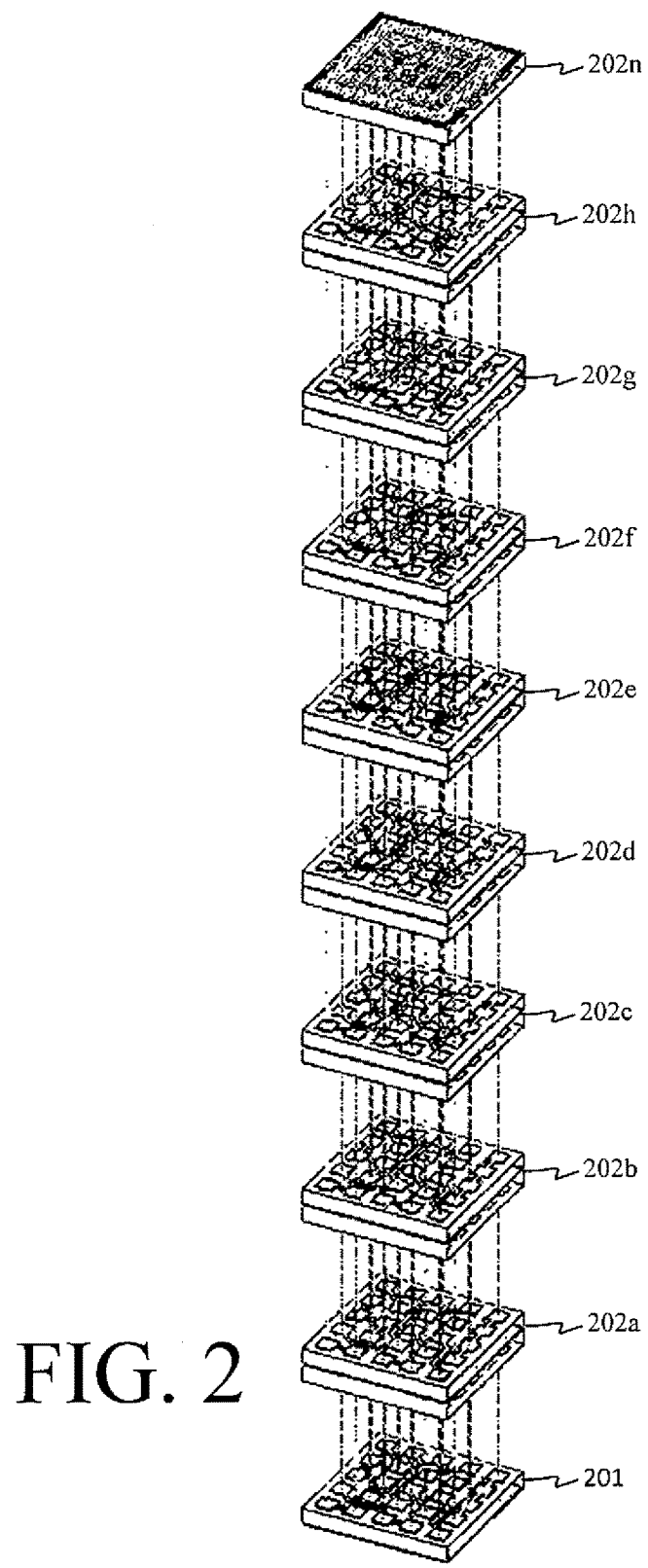
FIG. 2 illustrates the layers of a partitioned integrated circuit, in accordance with an illustrative embodiment of the invention.

FIG. 2 illustrates an integrated circuit divided into multiple layers, in accordance with an illustrative embodiment of the invention. The integrated circuit shown in FIG. 2 is comprised of an FEOL sub-circuit and nine BEOL sub-circuits labeled M1 through M9. The FEOL sub-circuit defines the transistor structure data and interconnection structure within those transistors. The BEOL sub-circuits define the circuit interconnections between the transistors or the interconnections between metal layers.

Typical contacts and vias of ordinary non-partitioned IC's account for approximately five percent of the surface area of a layer. As such, there is available space to expand the contact surface area of the redistributed contacts and vias to ensure a more suitable 3D stacking environment. For example, in an embodiment, the contact surface area for a typical interconnect layer may be increased to account for fifty percent of the surface area of that layer while assuming a checkerboard pattern.

Figure 3:
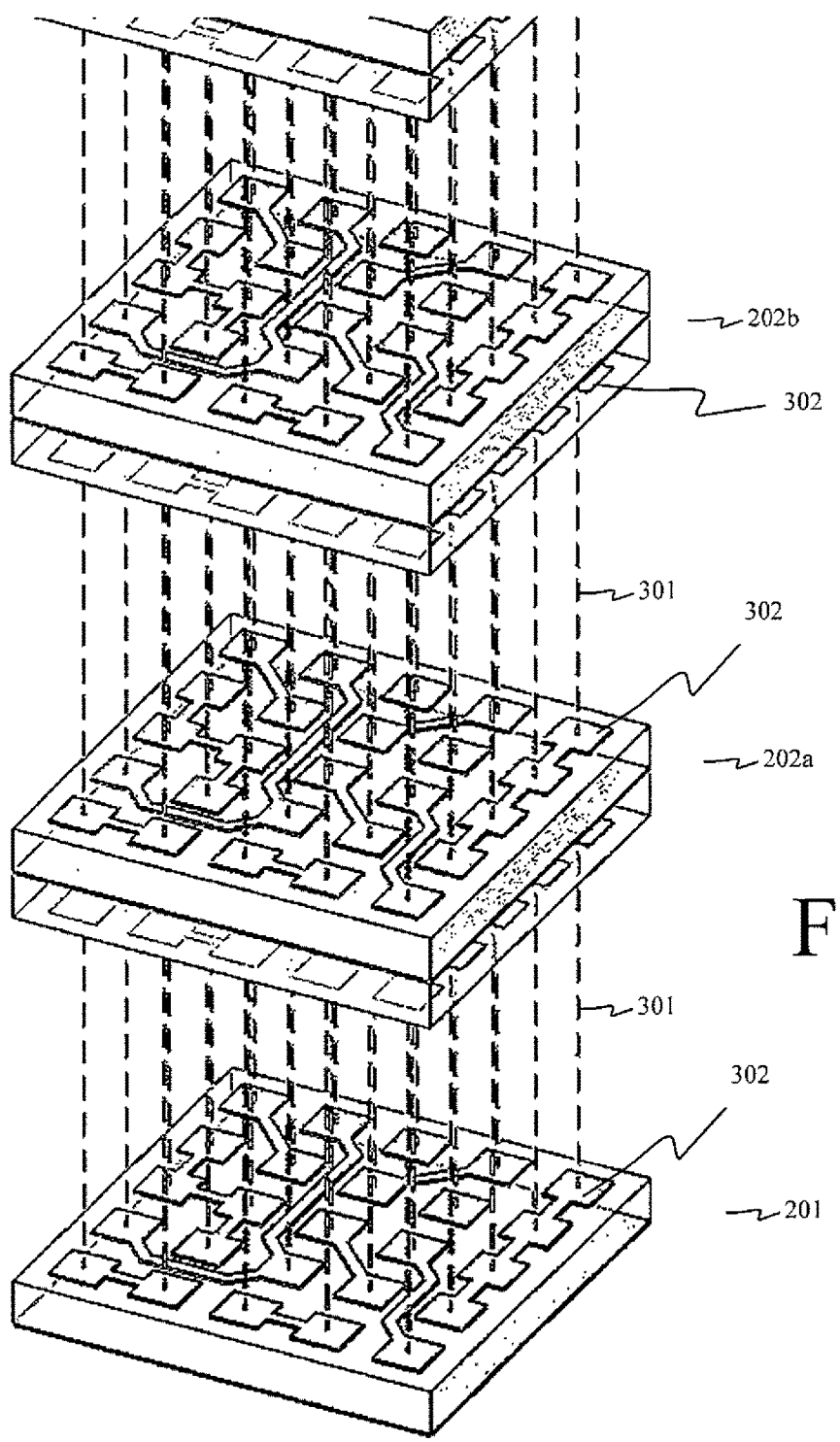
FIG. 3 illustrates the layers of the partitioned integrated circuit of FIG. 2 in further detail, in accordance with an illustrative embodiment of the invention.

FIG. 3 illustrates the layers of the partitioned integrated circuit of FIG. 2 in further detail, in accordance with an illustrative embodiment of the invention. The vertical current flow between IC sub-circuits, as represented by broken line 301, is facilitated by contact pads on the top and bottom surfaces of each IC sub-circuit. The FEOL sub-circuit 201 comprises a contact pad area 302 on a top face of the sub-circuit in electrical communication with a contact pad 302 on a bottom face of the adjacent BEOL sub-circuit 202a. This FEOL sub-circuit further comprises a contact pad 302 on a top face of the sub-circuit in electrical communication 301 with a contact pad 302 on a bottom surface of an adjacent BEOL sub-circuit 202b.

Figure 4:
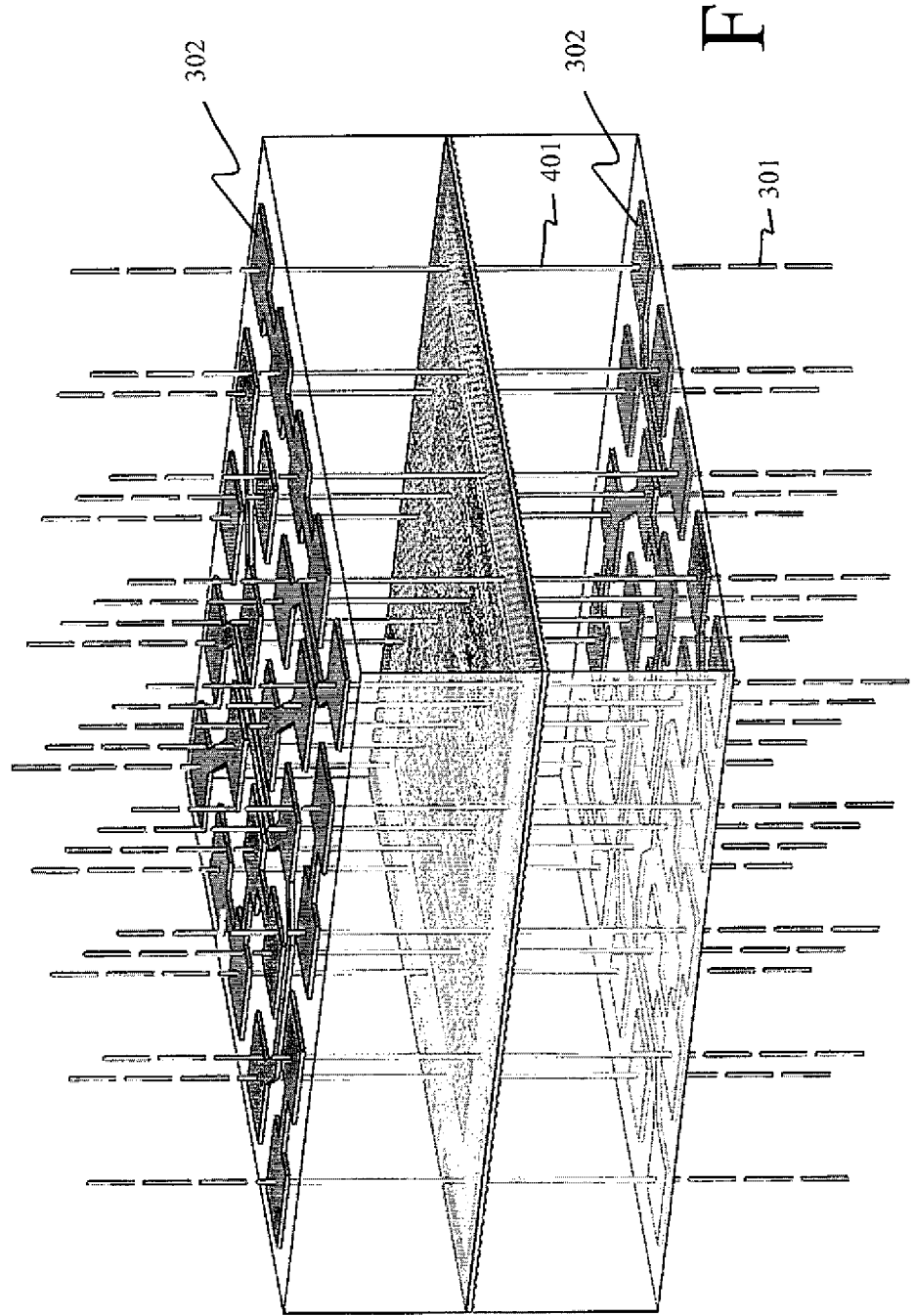
FIG. 4 illustrates a back end of line layer of the partitioned integrated circuit, in accordance with an illustrative embodiment of the invention.

FIG. 4 illustrates a back end of line layer of the partitioned integrated circuit, in accordance with an illustrative embodiment of the invention. The back end of line sub-circuit comprises a contact pad 302 on the top surface and a contact pad 302 on the bottom surface to facilitate vertical current flow to other sub-circuits. Each of the contact pads are in electrical communication with the metallization layer of the BEOL sub-circuit, as represented by solid line 401.

The use of this partitioning strategy transforms a single design file that contains a complete set of layout files, from which an entire integrated circuit can be fabricated and from which an adversary can deduce sensitive information relating to the functioning of that integrated circuit, into multiple layout files. No individual layout file, by itself, contains sufficient information such that an adversary who might acquire any one of these files could deduce the function of the original (aggregate) circuit as designed.

While the previous example describes a mask interface technician performing the step of portioning the IC layer file, in an embodiment, the partitioning step is an automated step executed by an algorithm implemented on a computing device. For example, the algorithm may parse the IC layout file to determine a type of each layer (i.e. transistor structure, metallization), a type of the preceding and subsequent layer and then partition the IC layout file into the plurality of layer files according to groupings of FEOL and BEOL layer files.

In step 104, the IC layer files are provided to more than one foundries. The design layer files comprising data for the FEOL sub-circuit layers and the design layer files comprising data for the BEOL sub-circuit layers are provided to separate foundries to ensure that the function of the IC cannot be deduced and further that the IP contained on the IC cannot be obtained by any one foundry. Further, if the IC comprises more than one FEOL sub-circuit layers or more than one BEOL sub-circuit layers, each individual layer may be sent to a separate foundry.

In step 105, each foundry builds a photomask for each layer of the integrated circuit. The design layer file is used by the foundry to create a photomask. The photomask is an opaque plate with transparencies which allow light to shine through and is used in the photolithographic process of semiconductor device fabrication to create the structures. Lithographic photomasks are typically transparent fused silica blanks covered with a pattern defined with a chrome metal-absorbing film.

In step 106, each foundry produces one or more layers of the integrated circuit. Each foundry employs the photomask corresponding to a layer of the integrated circuit to create that layer in a photolithographic process. The photolithographic process, also known as optical lithography or UV lithography, involves the use of light to transfer a geometric pattern from a photomask to a light-sensitive chemical "photoresist", or simply "resist," on the substrate. A series of chemical treatments then either engraves the exposure pattern into, or enables deposition of a new material in the desired pattern upon, the material underneath the photo resist.

In step 107, the individual layers are assembled into a complete integrated circuit. Upon the completion of the fabrication of all of the sub-circuits, the circuits are then either assembled onto a single interposer substrate (i.e. 2.5D technology) or assembled as a stacked die (i.e. 3D technology). In either case the assembled sub-circuits are tested to confirm the intended circuit functionality as initially designed. The assembly and test operations are both be performed within a vetted facility using vetted personnel.

The strength of this IP protection technique scheme is that its efficacy lies in the unaccountably large number of combinations and permutations of un-interconnected logic gates that would be faced by an adversary who might intercept either the FEOL sub-circuit or the BEOL sub-circuit.

We claim:

1. A method for reducing risk of intellectual property theft during the manufacture of integrated circuits, wherein the method comprises the steps of:
   designing an integrated circuit design file given no-regard to a subsequent division of the integrated circuit design file into a plurality of layer files;
   dividing the integrated circuit design file into a plurality of layer files, wherein the one or more layer files comprise at least one front end of line sub-circuit layer file and at least one back end of line sub-circuit layer file;
   for each layer file morphing one or more contacts and one or more vias of the sub-circuit into a pad pattern
   for each layer file in the plurality of layer files, creating two layout files redistributing one or more contacts and one or more vias of that layer file into pad arrays for facilitating vertical current flow between the vertically stacked sub-circuits;
   for each layer file in the plurality of layer files, creating two layout files defining vias for electrically connecting the pad arrays to the sub-circuit;
   providing the at least one front end of line sub-circuit layer file to a first foundry;
   providing the at least one back end of line sub-circuit layer file to a second foundry, wherein the second foundry is different from the first foundry; and
   assembling at least one front end of line sub-circuit fabricated at the first foundry and at least one back end of line sub-circuit fabricated at the second foundry into an integrated circuit.

2. The method of claim 1 wherein each of the at least one front end of line layer file comprises transistor structure data.

3. The method of claim 1 wherein each of the at least one back end of line layer file comprises metallization layer data.

4. The method of claim 1 wherein the step of dividing the integrated circuit design file into a plurality of layer files is performed by a computer device executing a partitioning algorithm.

5. The method of claim 1 wherein the step of assembling the at least one front end of line sub-circuit and the at least one back end of line layer into an integrated circuit comprises stacking the front end of line sub-circuit vertically with the back end of line sub-circuit.

6. The method of claim 5 wherein the step of assembling the at least one front end of line layer and the at least one back end of line layer into an integrated circuit comprises stacking the front end of line sub-circuit and the back end of line layer as a three dimensional integrated circuit.

7. The method of claim 5 wherein the step of assembling the at least one front end of line layer and the at least one back end of line layer into an integrated circuit comprises stacking the front end of line sub-circuit and the back end of line layer as a 2.5 dimensional integrated circuit.

8. The method of claim 1 wherein the method further comprises the step of simulating one or more parameters of the integrated circuit by adjusting signal delay times of an interconnect delay simulation model to account for the integrated circuit being divided into one or more vertically stacked sub-circuits.

9. A method for retrofitting an integrated circuit design to reduce the risk of intellectual property theft during the manufacture of integrated circuits, wherein the method comprises the steps of:
   receiving an integrated circuit design file designed;
   dividing the integrated circuit design file into a plurality of layer files, wherein the one or more layer files comprise at least one front end of line sub-circuit layer file and at least one back end of line sub-circuit layer file;
   for each layer file morphing one or more contacts and one or more vias of the sub-circuit into a pad pattern
   for each layer file in the plurality of layer files, creating two layout files redistributing one or more contacts and one or more vias of that layer file into pad arrays for facilitating vertical current flow between the vertically stacked sub-circuits;
   for each layer file in the plurality of layer files, creating two layout files defining vias for electrically connecting the pad arrays to the sub-circuit;
   providing the at least one front end of line sub-circuit layer file to a first foundry;
   providing the at least one back end of line sub-circuit layer file to a second foundry, wherein the second foundry is different than the first foundry; and
   assembling at least one front end of line sub-circuit fabricated at the first foundry and at least one back end of line sub-circuit fabricated at the second foundry into an integrated circuit.

* * * * *